United States Patent
Fung et al.

(10) Patent No.: US 7,888,191 B2
(45) Date of Patent: Feb. 15, 2011

(54) FORMING FLOATING BODY RAM USING BULK SILICON SUBSTRATE

(75) Inventors: Ka-Hing Fung, Hsin-Chu (TW); Carlos H. Diaz, Mountain View, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/638,768

(22) Filed: Dec. 15, 2009

(65) Prior Publication Data

US 2010/0144102 A1   Jun. 10, 2010

Related U.S. Application Data

(62) Division of application No. 11/803,233, filed on May 14, 2007, now Pat. No. 7,649,228.

(51) Int. Cl.
*H01L 21/84* (2006.01)
(52) U.S. Cl. ................ 438/151; 438/164; 257/E21.646
(58) Field of Classification Search ................ 438/151, 438/164; 257/E21.646
See application file for complete search history.

(56) References Cited

U.S. PATENT DOCUMENTS

| 5,897,351 | A | 4/1999 | Forbes |
| 2004/0195610 | A1 | 10/2004 | Morikado |
| 2005/0242406 | A1 | 11/2005 | Hareland et al. |
| 2007/0102756 | A1 | 5/2007 | Lojek |
| 2007/0267676 | A1 | 11/2007 | Kim et al. |
| 2007/0284648 | A1 | 12/2007 | Park et al. |

OTHER PUBLICATIONS

Moore, S.K., "Winner: Masters of Memory," www.spectrum.ieee.org/print/4839, downloaded May 14, 2007, 7 pages.

*Primary Examiner*—Minh-Loan T Tran
(74) *Attorney, Agent, or Firm*—Slater & Matsil, L.L.P.

(57) ABSTRACT

A method for forming a semiconductor device is provided. The method comprises providing a semiconductor structure comprising a semiconductor substrate and a dielectric layer on the semiconductor substrate, wherein the dielectric layer has an opening through which the semiconductor substrate is exposed; forming a semiconductor strip on the dielectric layer and adjacent the opening, wherein the semiconductor strip is electrically isolated from the semiconductor substrate; forming a gate dielectric over a portion of the semiconductor strip that is over the dielectric layer; forming a gate electrode over the gate dielectric; and forming a source/drain region in the semiconductor strip.

20 Claims, 9 Drawing Sheets

FORMING FLOATING BODY RAM USING BULK SILICON SUBSTRATE

This application is a divisional of prior U.S. patent application Ser. No. 11/803,233, filed on May 14, 2007, entitled "Forming Floating Body RAM Using Bulk Silicon Substrate," which application is hereby incorporated herein by reference.

TECHNICAL FIELD

This invention relates generally to semiconductor devices, and more particularly to memory cells, and even more particularly to structures and formation methods of zero-capacitor random access memory (Z-RAM) cells.

BACKGROUND

Zero-capacitor random access memory (Z-RAM) cells, also referred to as floating body RAM (FB-RAM) cells, are one-transistor (1T) dynamic RAM cells having floating bodies as charge storages.

FIG. 1 illustrates a structure of a conventional Z-RAM cell 2, which is formed on a buried oxide layer 4. Silicon layer 5 is located on buried oxide layer 4, and shallow trench isolation (STI) regions 6 are formed in silicon layer 5. STI regions 6 encircle a silicon region (including regions 8, 10 and 12), from which Z-RAM cell 2 is formed. Z-RAM cell 2 includes gate electrode 14, gate dielectric 16, source region 8, drain region 10, and floating body 12 between source 8 and drain 10. Due to the isolation by buried oxide layer 4 and STI regions 6, Z-RAM cell 2 is floating.

To write a "1" to Z-RAM cell 2, electrons may be accelerated from source 8 to drain 10 and crash into silicon atoms, creating pairs of electrons and holes. The holes accumulate in floating body 12 and act as the stored bit. To write a "0" to Z-RAM cell 2, the holes may be drawn out through source 8, leaving excess negative charges.

The stored bits may be read by applying a voltage between source region 8 and drain region 10, and measuring the resulting current. For example, a cell storing a "1" passes more current than a Z-RAM cell storing a "0," hence the state of Z-RAM cell 2 can be determined.

Compared to a conventional dynamic RAM (DRAM) cell, which includes a capacitor for storing a state and a transistor for accessing the capacitor, a Z-RAM cell only includes one transistor, the structure of a Z-RAM cell is thus simpler, and the density of Z-RAM memories may be higher.

The improvements in density and structure, however, are achieved with a price. Currently, Z-RAM memories are formed on silicon-on-insulator (SOI) substrates. SOI substrates, however, cost much more than bulk silicon substrates, the price difference being as high as four times. Accordingly, novel structures and formation methods are needed to reduce the production cost of Z-RAM memories.

SUMMARY

In accordance with an aspect of the present invention, a method of forming a semiconductor device comprises providing a semiconductor structure comprising a semiconductor substrate and a dielectric layer on the semiconductor substrate, wherein the dielectric layer has an opening through which the semiconductor substrate is exposed; forming a semiconductor strip on the dielectric layer and adjacent the opening, wherein the semiconductor strip is electrically isolated from the semiconductor substrate; forming a gate dielectric over a portion of the semiconductor strip that is over the dielectric layer; forming a gate electrode over the gate dielectric; and forming a source/drain region in the semiconductor strip.

In accordance with another aspect of the present invention, a method of forming a semiconductor structure comprises providing a semiconductor substrate; forming a dielectric layer on the semiconductor substrate; forming a slit in the dielectric layer, wherein the semiconductor substrate is exposed through the slit; epitaxially growing a semiconductor material on the semiconductor substrate through the slit to form an epitaxial region, wherein the epitaxial region comprises a portion extended on the dielectric layer; removing a portion of the epitaxial region over the slit to form a semiconductor strip; forming a gate dielectric over a top surface and sidewalls of the semiconductor strip, wherein the gate dielectric layer extends across the slit; forming a gate electrode over the gate dielectric; and performing an implantation to form a source/drain region in the semiconductor strip.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel zero-capacitor random access memory (Z-RAM) cell structure and methods of forming the same are provided. The intermediate stages of manufacturing a preferred embodiment of the present invention are illustrated. Throughout the various views and illustrative embodiments of the present invention, like reference numbers are used to designate like elements. Throughout the description, each figure number may be followed by a letter A, B or C, indicating different views of a same structure or different embodiments having similar structures.

Figure 1:
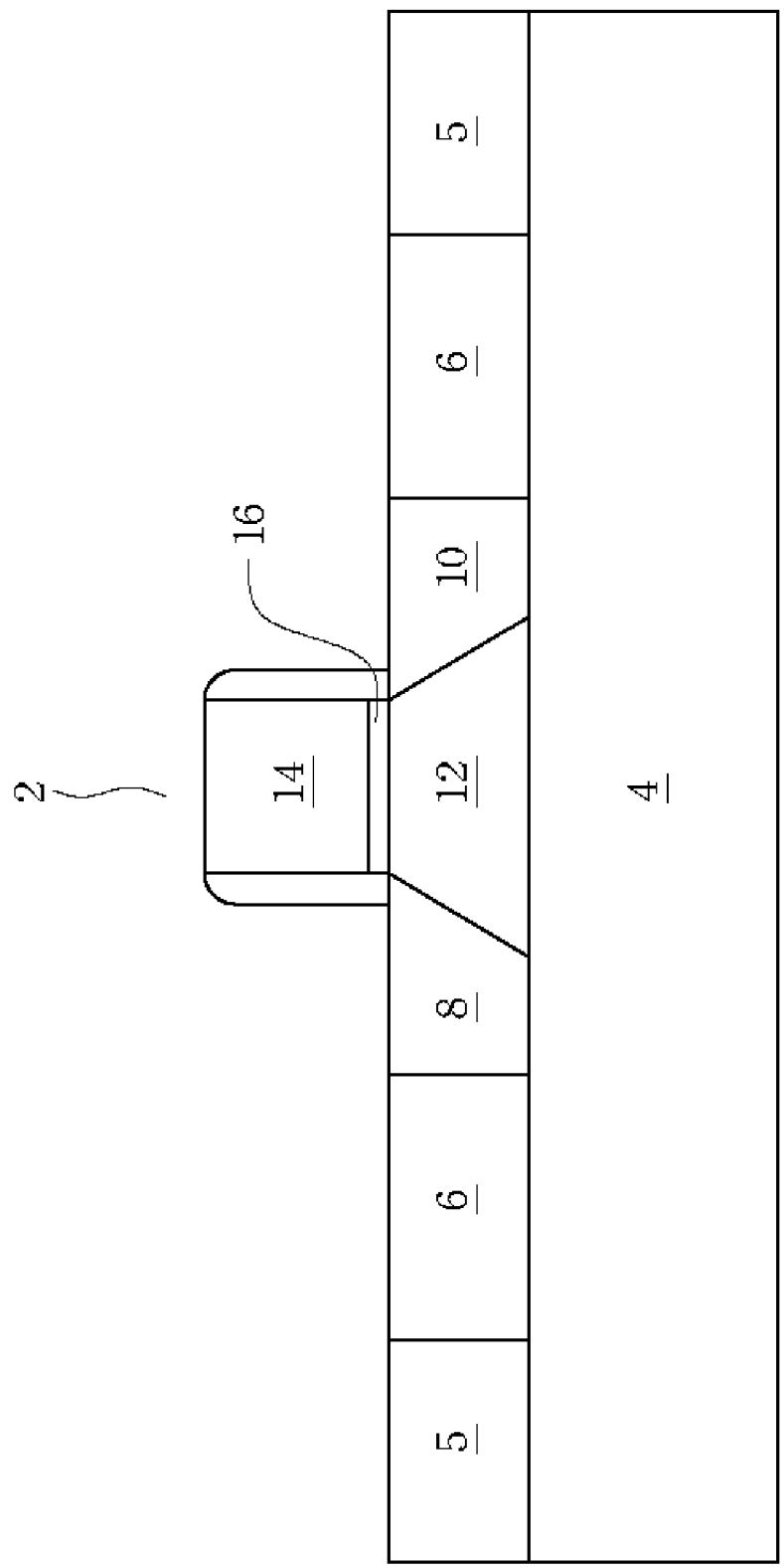
FIG. 1 illustrates a conventional Zero-capacitor random access memory (Z-RAM) cell.
Figure 2:
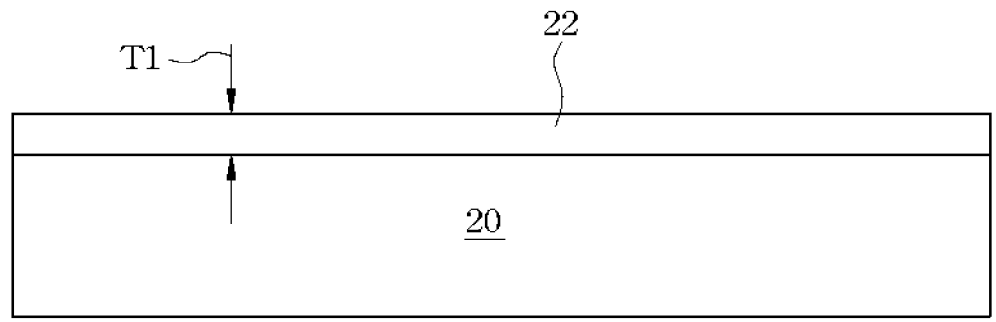
FIGS. 2 through 9C are top views and cross-sectional views of intermediate stages in the manufacturing of an embodiment of the present invention.

Referring to FIG. 2, substrate 20 is provided. In the preferred embodiment, substrate 20 is a bulk silicon substrate. In other embodiments, substrate 20 may include a compound semiconductor material comprising commonly used semiconductor elements such as silicon, germanium, carbon, and combinations thereof.

Dielectric layer 22 is formed on substrate 20. In an embodiment, dielectric layer 22 includes an oxide, for example, silicon oxide, and can be formed using low pressure chemical vapor deposition (LPCVD), thermal oxidation, or other commonly used formation methods. Dielectric layer 22 may include other dielectric materials, such as silicon nitride, silicon oxynitride, silicon carbide, and combinations thereof. The thickness T1 of dielectric layer 22 may be between about 200 Å and about 1000 Å. One skilled in the art will realize, however, that the dimensions recited throughout the description are merely examples, and can be scaled accordingly with the scaling of technical generations.

Figure 3:
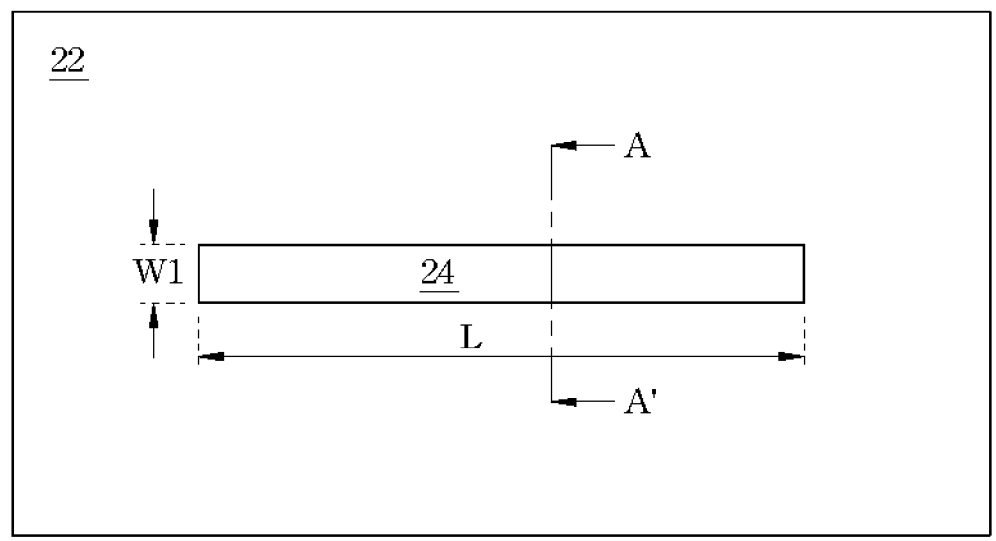

FIG. 3 illustrates a top view of slit 24 in dielectric layer 22, wherein silicon substrate 20 is exposed through slit 24. The width W1 of slit 24 is preferably between about 500 Å and about 2000 Å. The length L of slit 24 may be long enough for forming a Z-RAM memory cell, or a plurality of Z-RAM memory cells. As is known in the art, slit 24 may be formed using dry etching or other applicable methods.

Figure 4:
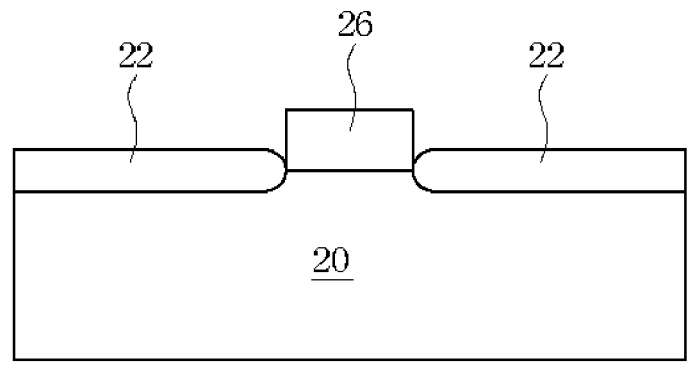

Alternatively, dielectric layer 22 and slit 24 may be formed by a thermal oxidation. FIG. 4 illustrates a cross-sectional view of the thermal oxidation process. Mask layer 26 is first formed and patterned, covering the desired location of slit 24. Mask layer 26 may be formed of silicon nitride. A thermal oxidation is performed, forming thermal oxide 22, which is formed only on exposed surface of semiconductor substrate 20, but not on the surface covered by mask layer 26. Mask layer 26 is then removed, leaving slit 24 in thermal oxide 22. The resulting structure is similar to the structure shown in FIG. 3.

Figure 5A:
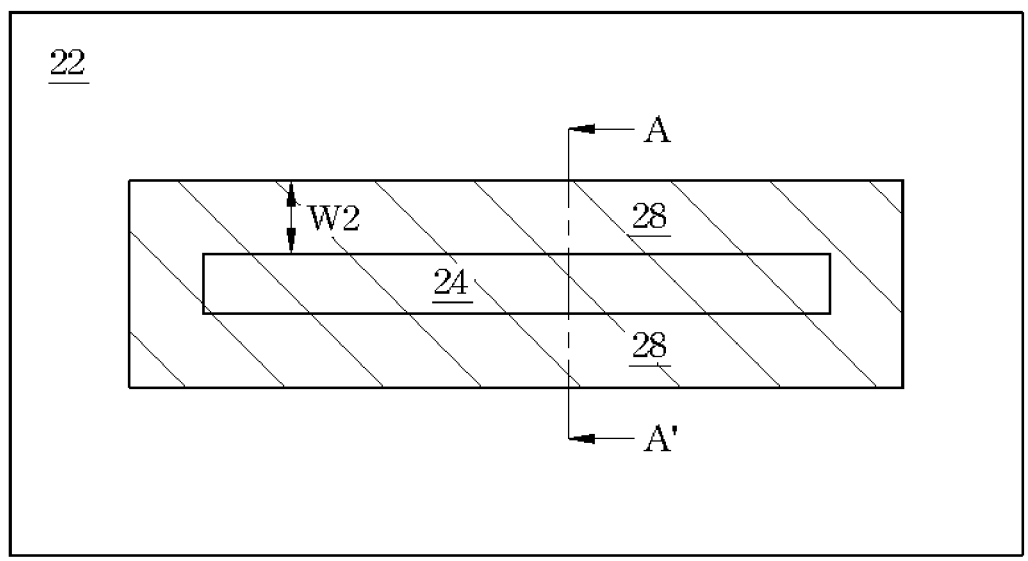
Figure 5B:
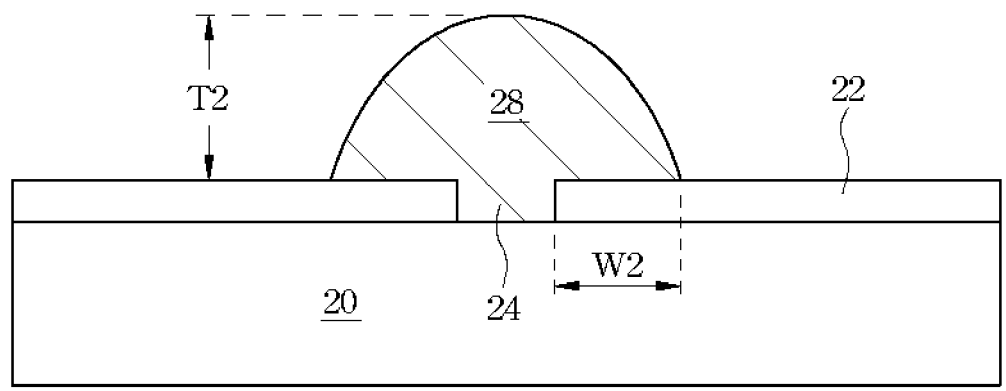

An epitaxial growth is then performed, and the resulting structure is shown in FIGS. 5A and 5B. FIG. 5A illustrates a top view, and FIG. 5B illustrates a cross-sectional view taken along a plane crossing line A-A' in FIG. 5A. The epitaxial growth results in the formation of epitaxial region 28, wherein the epitaxial growth starts from the exposed semiconductor substrate 20, through slit 24, and continues to grow upward. After the top surface of epitaxial region 28 exceeds the top surface of dielectric layer 22, epitaxial region 28 grows both vertically and horizontally, and hence covers the portions of dielectric layer 22 surrounding slit 24. In an exemplary embodiment, the portion of epitaxial region 28 over the top surface of dielectric layer 22 has a thickness T2 (refer to FIG. 5B) of greater than about 700 Å, and more preferably between about 700 Å and about 2000 Å. Accordingly, the portions of epitaxial region 28 on dielectric layer 22 have width W2 of between about 700 Å and about 2000 Å. From FIG. 5A, it is noted that slit 24 is completely covered by epitaxial region 28.

Figure 6A:
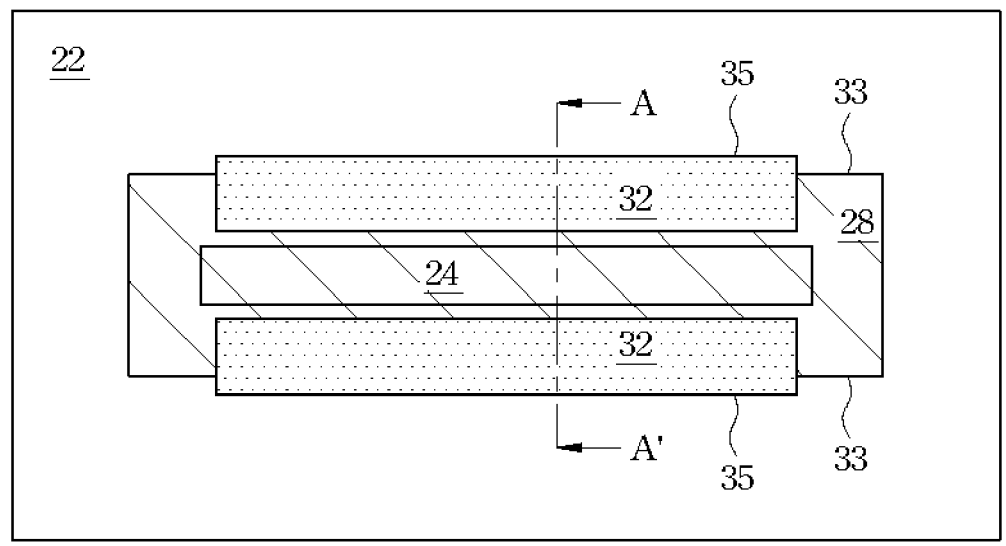
Figure 6B:
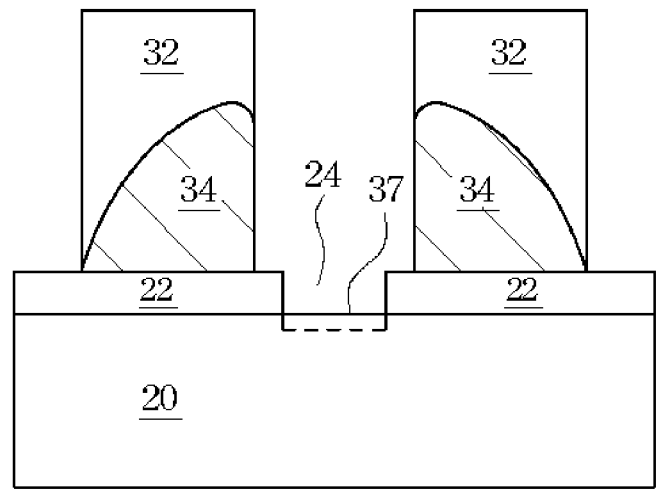

FIGS. 6A and 6B illustrate the patterning of epitaxial region 28. Referring to FIG. 6A, mask 32 is formed and patterned, and only the portions shaded with dots remain. In an embodiment, the edges 35 of masks 32 extend further from slit 24 than the respective edges 33 of epitaxial region 28. In other embodiments, edges 35 substantially overlap, and may even be closer to slit 24 than the respective edges 33. The portions of epitaxial region 28 not masked by mask 32 are then removed, leaving epitaxial strips 34 (refer to FIG. 7A). FIG. 6B illustrates a cross-sectional view of the structure shown in FIG. 6A, wherein the cross-sectional view is taken along the plane crossing line A-A' in FIG. 6A. Masks 32 are then removed. After the patterning, the top surface 37 of the semiconductor material in slit 24 is recessed below the top surface of dielectric layer 22 so that the epitaxial strips 34 on two sides of slit 24 are disconnected from each other. In an embodiment, a layer of epitaxial region 28 may be left in the slit 24. In other embodiments, all epitaxial material is removed from slit 24. In yet other embodiments, the top surface 37 may even be lower than the bottom surface of dielectric layer 22 after the patterning of epitaxial region 28, as is shown by the dashed line in FIG. 6B.

Figure 7A:
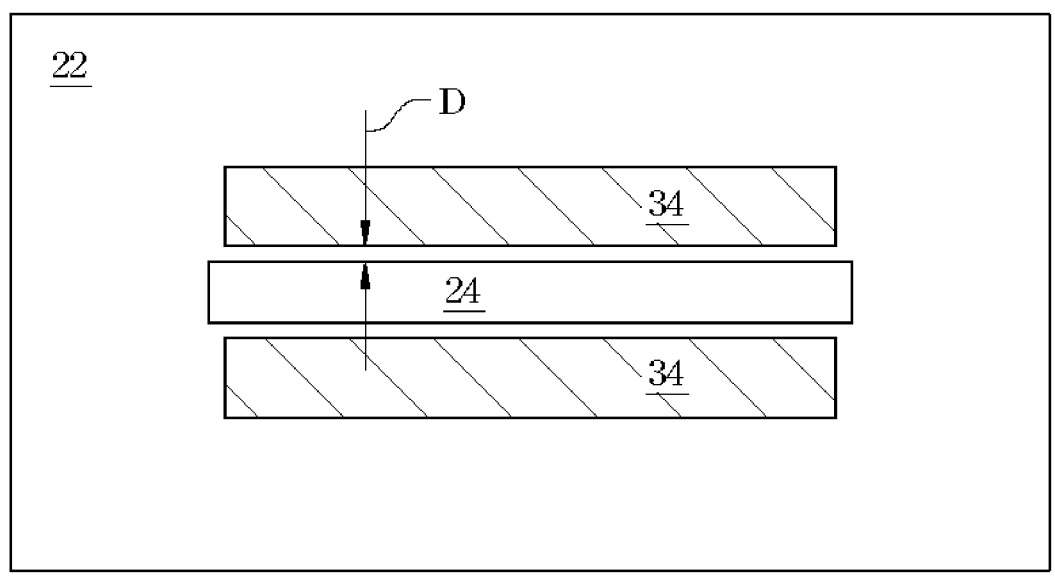
Figure 7B:
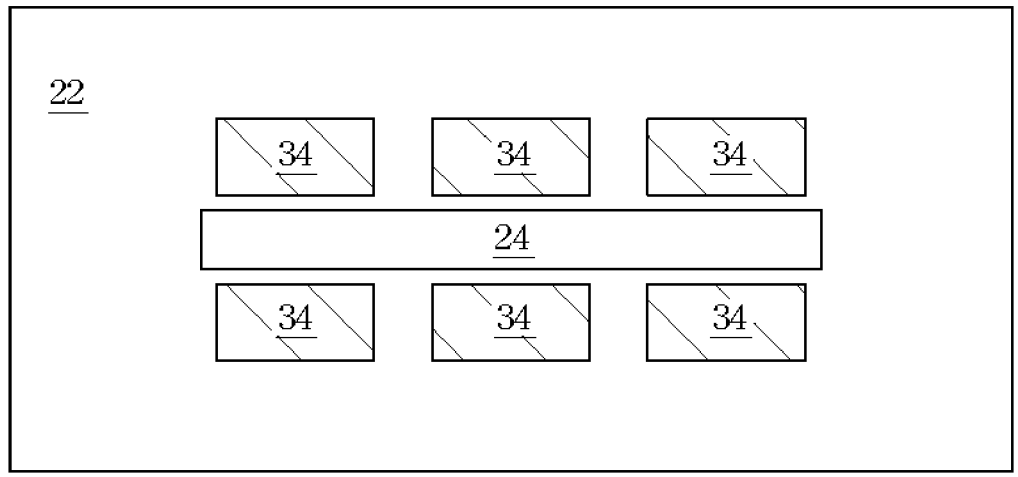

FIG. 7A illustrates a top view of the resulting structure. After the patterning, the edges of epitaxial strips 34 and the respective edge of slit 24 preferably have a distance D of between about 200 Å and about 500 Å. FIG. 7B illustrates a variation of the embodiment as shown in FIG. 7A, wherein epitaxial strips 34 are patterned to form a plurality of short strips 34, each for forming one or more Z-RAM cell.

Figure 8A:
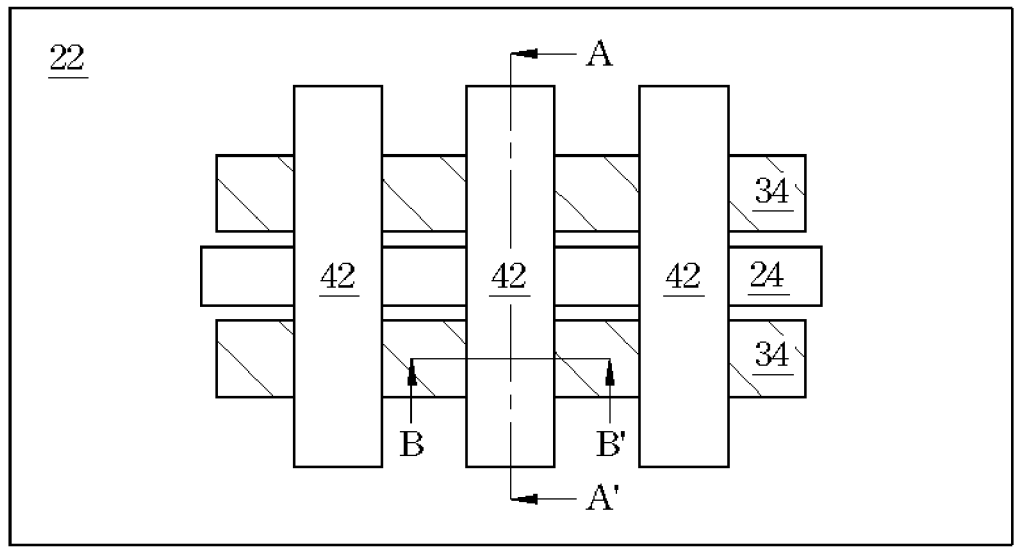
Figure 8B:
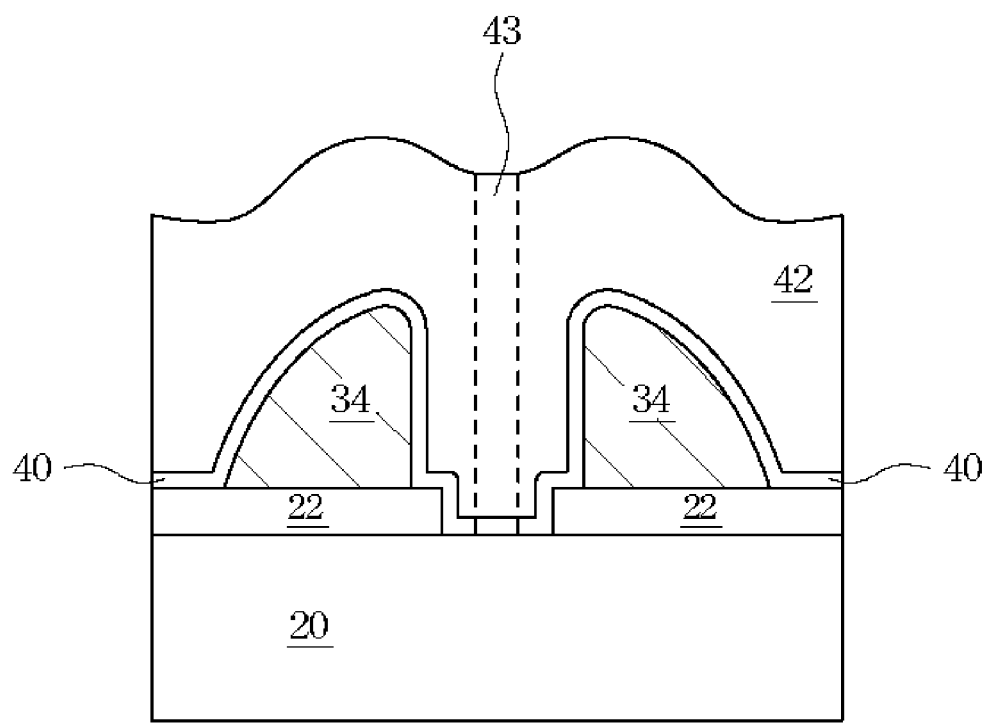
Figure 8C:
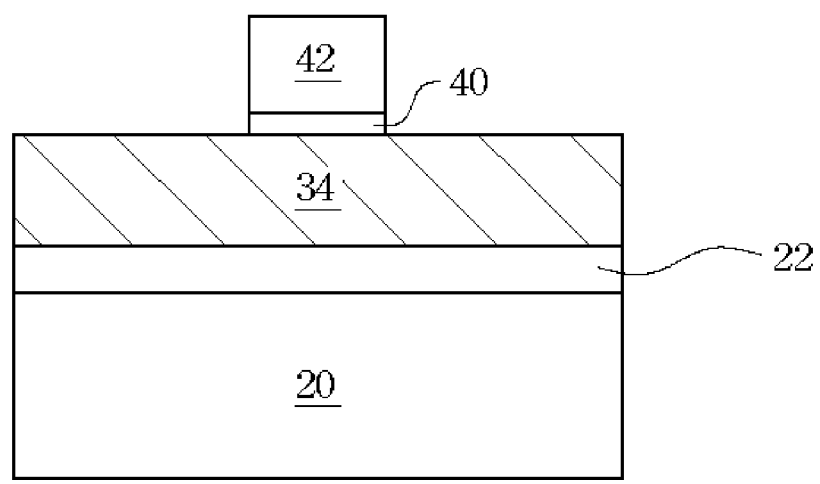

Referring to FIGS. 8A, 8B and 8C, gate dielectrics 40 and gate electrodes 42 are formed and patterned. FIGS. 8B and 8C illustrate cross-sectional views of the structure shown in FIG. 8A, wherein the cross-sectional views are taken along planes crossing lines A-A' and B-B' in FIG. 8A, respectively. In the preferred embodiment, gate dielectrics 40 and gate electrodes 42 are simultaneously formed with the formation of the gate dielectrics and gate electrodes of the MOS devices in input/output (I/O) circuits. Advantageously, gate dielectrics of I/O MOS devices are thicker than the gate dielectrics of core circuits, and hence the leakage currents are smaller. As is known in the art, the formation of gate dielectrics 40 and gate electrodes 42 may include blanket forming a gate dielectric layer and a gate electrode layer, and patterning the gate dielectric layer and the gate electrode layer, leaving gate dielectrics 40 and gate electrodes 42.

In an embodiment, the portions of gate electrode 42 on two sides of slit 24 (refer to FIG. 7A) form an interconnected portion. In other embodiments, the portion of gate electrode strip in region 43 is removed, so that the gate electrode 42 on one side of the slit 24 is physically isolated from the gate electrode 42 on the opposite side.

In the preferred embodiment, gate dielectrics 40 include silicon oxide formed by a thermal growth technique in a wet or dry environment, or by a chemical vapor deposition (CVD) technique such as low temperature CVD (LTCVD), low pressure CVD (LPCVD), plasma enhanced CVD (PECVD), etc. In other embodiments, gate dielectrics 40 include silicon nitride, silicon oxynitride or other nitrogen-containing dielectric materials, and may have an oxide-nitride-oxide (ONO) structure. Gate electrodes 42 preferably include polysilicon. Alternatively, other conductive materials, such as metals, metal nitrides, metal silicides, and the like, can be used. Please note that for forming a Z-RAM cell, only one gate electrode strip is needed. For forming a Z-RAM array, a plurality of gate electrode strips may be formed parallel to each other, although only three gate strips 42 are shown in FIG. 8A.

Figure 9A:
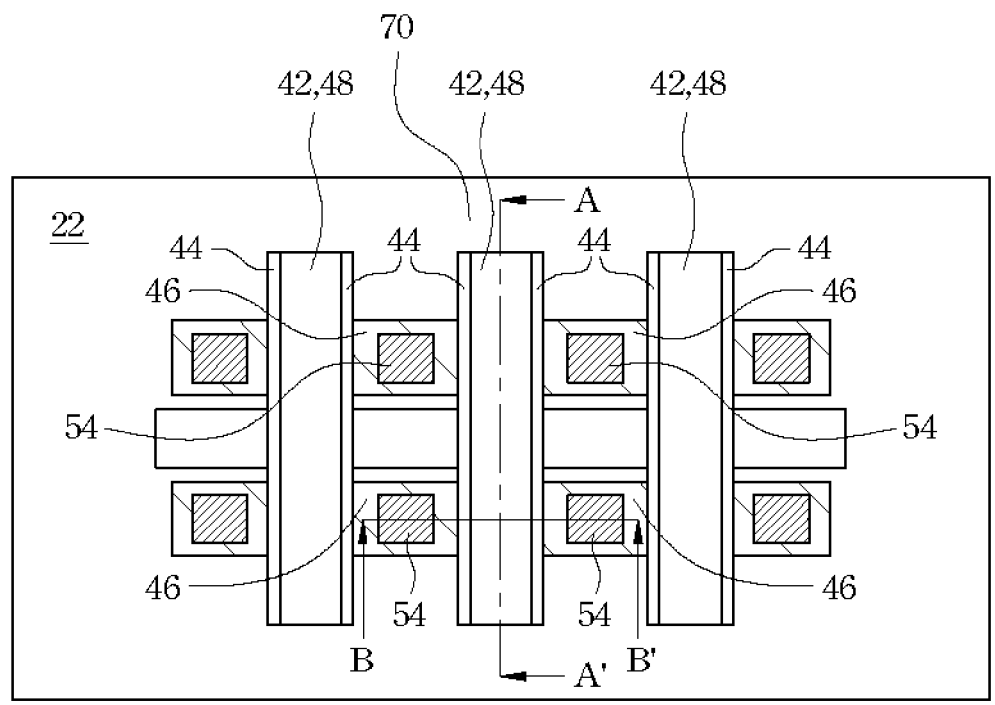
Figure 9B:
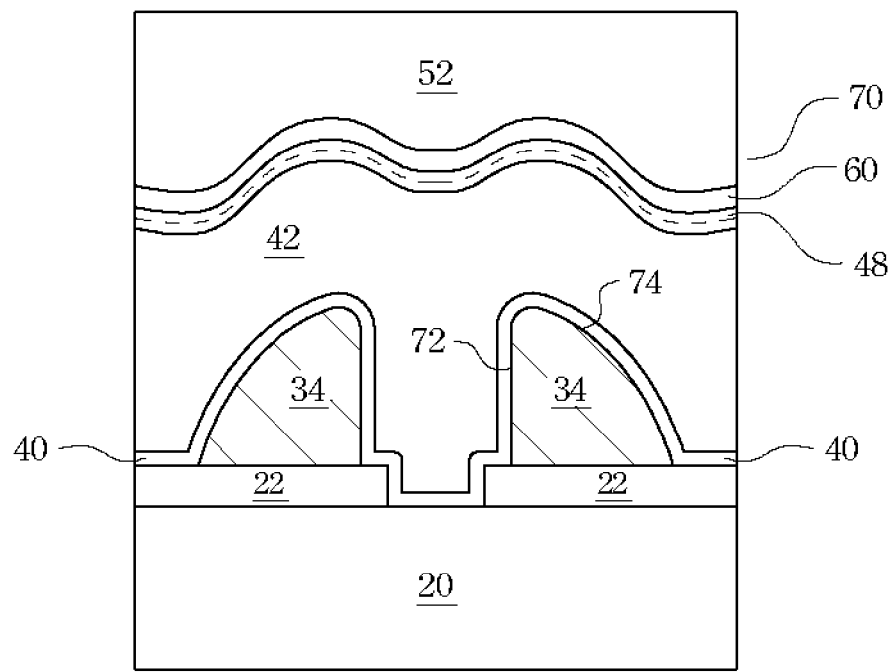
Figure 9C:
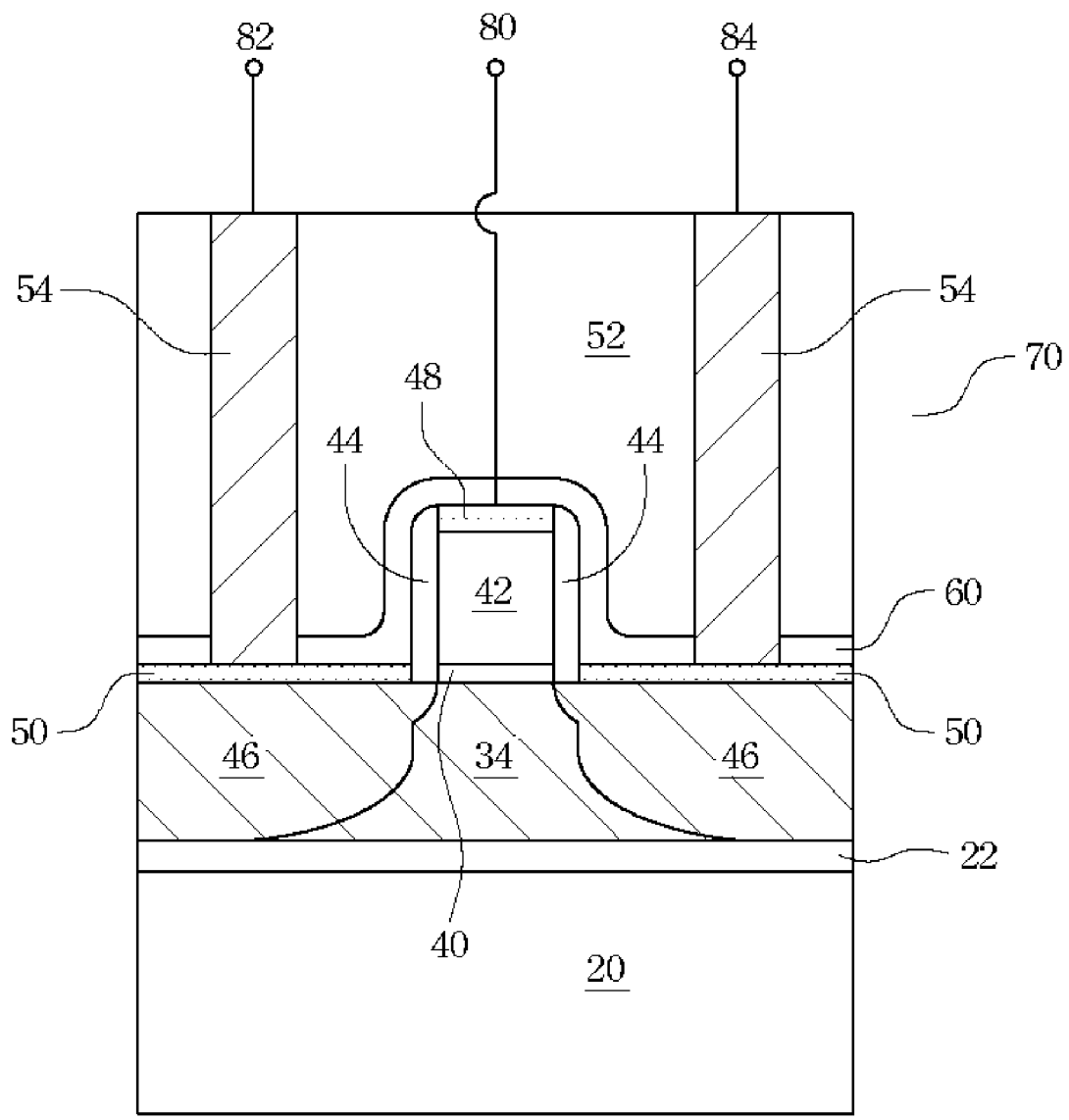

In subsequent process steps, as are shown in FIGS. 9A, 9B and 9C, gate spacers 44, source/drain regions 46, gate silicide region 48 and source/drain silicide regions 50 are formed. FIGS. 9B and 9C illustrate cross-sectional views of the structure shown in FIG. 9A, wherein the cross-sectional views are again taken along planes crossing lines A-A' and B-B', respectively. As is known in the art, the formation of gate spacers 44 preferably includes blanket forming a dielectric layer and patterning the gate dielectric layer to remove horizontal portions, leaving gate spacers 44. Source/drain regions 46 are preferably formed by implanting desirable impurities. Lightly doped source/drain regions (not shown) may also be formed if desirable. Gate silicide regions 48 and source/drain silicide regions 50 may be formed by forming a metal layer, and performing an annealing to react the metal layer with the silicon in the exposed gate electrode 42 and source/drain regions 46. Z-RAM cell 70 is thus formed.

Next, as also shown in FIGS. 9A through 9C, etch stop layer 60, inter-layer dielectric 52, and contacts 54 are formed. The formation processes are well known in the art, and thus are not repeated herein. The resulting Z-RAM cell (MOS device) may be connected into a Z-RAM cell by forming a conductive feature connecting gate electrode 42 to a word-line 80, and conductive features connecting source/drain regions 46 to a source line 82 and a bit-line 84.

Referring again to FIG. 9B, it is noted that Z-RAM cell 70 has a 3D structure, wherein channel regions are also formed near both sidewalls 72 and 74 of epitaxial strip 34. Accordingly, it is expected that the read and write speeds of Z-RAM cell 70 are improved. Since sidewall 72 is formed by etching, it is substantially vertical, while sidewall 74 is substantially slant.

In order to form a Z-RAM array, a plurality of slits and a plurality of semiconductor strips may be formed parallel to each other, and each gate dielectric strip and gate electrode strip may extend across the plurality of semiconductor strips.

The embodiments of the present invention are formed using bulk semiconductor substrates instead of SOI substrates. Accordingly, the manufacturing cost is significantly reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   providing a semiconductor structure comprising a semiconductor substrate and a dielectric layer on the semiconductor substrate, wherein the dielectric layer has an opening through which the semiconductor substrate is exposed;
   forming a semiconductor strip on the dielectric layer and adjacent the opening, wherein the semiconductor strip is electrically isolated from the semiconductor substrate;
   forming a gate dielectric over a portion of the semiconductor strip that is over the dielectric layer;
   forming a gate electrode over the gate dielectric; and
   forming a source/drain region in the semiconductor strip.

2. The method of claim 1, wherein the step of forming the semiconductor strip comprises:
   growing a semiconductor material on the semiconductor substrate through the opening to form a grown region, wherein the grown region comprises a portion extended on the dielectric layer; and
   removing a first portion of the grown region over the opening to isolate a second portion of the grown region on the dielectric layer from the semiconductor substrate, wherein the second portion of the grown region forms the semiconductor strip.

3. The method of claim 2, wherein the step of removing the first portion of the grown region comprises:
   forming a mask over the second portion of the grown region, wherein the mask is not over the opening; and
   etching the grown region to remove the second portion of the grown region.

4. The method of claim 2, wherein the step of removing the first portion is such that the grown region in the opening has a top surface level to or below a top surface of the dielectric layer.

5. The method of claim 2, wherein the step of removing the first portion is such that the grown region is completely removed from the opening.

6. The method of claim 2, wherein a distance between the semiconductor strip and the opening is greater than about 200 Å.

7. The method of claim 1 further comprising patterning the semiconductor strip into a plurality of strips.

8. The method of claim 1 further comprising:
   connecting the gate electrode to a word-line of a memory array; and
   connecting the source/drain region to a bit-line of the memory array.

9. The method of claim 1, where the step of providing the semiconductor structure comprises:
   providing the semiconductor substrate; and
   forming the dielectric layer on the semiconductor substrate.

10. The method of claim 9, wherein the step of forming the dielectric layer is performed using low-pressure chemical vapor deposition (LPCVD).

11. The method of claim 9, wherein the step of forming the dielectric layer comprises:
    forming a mask on the semiconductor substrate;
    performing an oxidation to form an oxide on an exposed surface of the semiconductor substrate; and
    removing the mask to form the opening.

12. The method of claim 9 further comprising forming the opening in the dielectric layer by etching the dielectric layer.

13. A method of forming a semiconductor structure, the method comprising:
    providing a semiconductor substrate;
    forming a dielectric layer on the semiconductor substrate;
    forming a slit in the dielectric layer, wherein the semiconductor substrate is exposed through the slit;
    epitaxially growing a semiconductor material on the semiconductor substrate through the slit to form an epitaxial region, wherein the epitaxial region comprises a portion extended on the dielectric layer;
    removing a portion of the epitaxial region over the slit to form a semiconductor strip;
    forming a gate dielectric over a top surface and sidewalls of the semiconductor strip, wherein the gate dielectric layer extends across the slit;
    forming a gate electrode over the gate dielectric; and
    performing an implantation to form a source/drain region in the semiconductor strip.

14. The method of claim 13, wherein the steps of forming the dielectric layer and forming the slit in the dielectric layer together comprise:
    forming a mask on the semiconductor substrate;
    oxidizing a surface of the semiconductor substrate thereby forming the dielectric layer; and
    removing the mask, wherein the slit is formed in a space occupied by the mask.

15. The method of claim 13, wherein the step of forming the slit in the dielectric layer comprises etching the dielectric layer.

16. The method of claim 13, wherein the step of removing the portion of the epitaxial region over the slit comprises removing the portion of the epitaxial region such that no epitaxial region that is electrically coupled to the semiconductor substrate has a top surface higher than a top surface of the dielectric layer.

17. The method of claim 13, wherein the step of removing the portion of the epitaxial region further forms an additional semiconductor strip on an opposite side of the slit than the semiconductor strip, wherein the semiconductor strip and the additional semiconductor strip are parallel to each other.

18. The method of claim 17, wherein the gate dielectric and the gate electrode further extend over a top surface and sidewalls of the additional semiconductor strip.

19. The method of claim 13 further comprising:
   forming an etch stop layer (ESL) over the semiconductor strip and the gate electrode, wherein the ESL has at least a portion across the slit; and
   forming an inter-layer dielectric over the ESL.

20. The method of claim 13 further comprising forming additional gate dielectrics and additional gate electrodes parallel to each other, wherein each of the additional gate dielectrics and the additional gate electrodes extend across the slit and over a portion of the semiconductor strip.

* * * * *